United States Patent [19]
Tanaka et al.

[11] Patent Number: 4,810,896
[45] Date of Patent: Mar. 7, 1989

[54] PHOTOELECTRIC CONVERSION DEVICE WITH REDUCED FIXED PATTERN NOISES

[75] Inventors: Nobuyoshi Tanaka, Tokyo; Yoshio Nakamura; Shigetoshi Sugawa, both of Atsugi; Hayao Ohzu, Hiratsuka, all of Japan

[73] Assignee: Canon Kabushiki Kaisha, Tokyo, Japan

[21] Appl. No.: 73,220

[22] Filed: Jul. 14, 1987

[30] Foreign Application Priority Data
Jul. 17, 1986 [JP] Japan .................. 61-168286

[51] Int. Cl.⁴ .................. H01L 27/14; H01L 31/00
[52] U.S. Cl. .................. 250/578; 358/213.11; 358/213.18
[58] Field of Search .................. 250/578, 211 R, 211 J; 307/30 D, 30 H; 358/212, 213.11, 213.17, 213.15, 213.18

[56] References Cited
U.S. PATENT DOCUMENTS

| | | | |
|---|---|---|---|
| 4,274,113 | 6/1981 | Ohba et al. | 358/213.18 |
| 4,363,963 | 12/1982 | Ando | 250/211 J |
| 4,445,117 | 4/1984 | Gaalema et al. | 358/213.11 |
| 4,531,156 | 7/1985 | Nishizawa | 358/212 |
| 4,571,624 | 2/1986 | Nishizawa et al. | 250/578 |
| 4,686,554 | 8/1987 | Ohmi | 357/30 |
| 4,712,138 | 12/1987 | Kyuma | 358/213.31 |

FOREIGN PATENT DOCUMENTS
55-28456   7/1980   Japan .

Primary Examiner—Edward P. Westin
Attorney, Agent, or Firm—Fitzpatrick, Cella, Harper & Scinto

[57] ABSTRACT

A photoelectric conversion device includes a first main electrode region of a first conductivity type; a second main electrode region of a first conductivity type; a control electrode region of a second conductivity type opposite to the first conductivity type serving as an accumulation region for carriers induced by an electromagnetic wave; a first circuit for setting the control electrode region selectively at a constant potential and at a floating state; and a second circuit for setting the first main electrode region selectively at a low impedance state and at a floating state; whereby the first and second circuits control the carrier removal, accumulation and readout operations in accordance with the selection conditions by the first and second circuits.

16 Claims, 12 Drawing Sheets

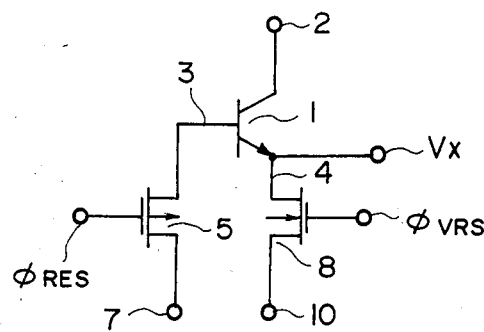
F I G. 1A
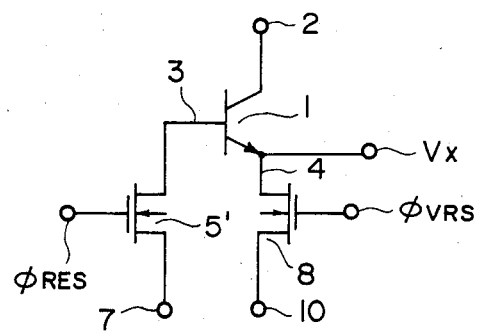
F I G. 1B
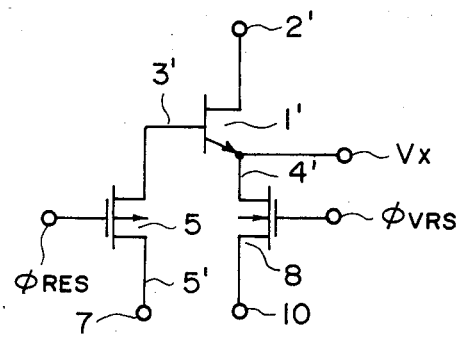
F I G. 1C

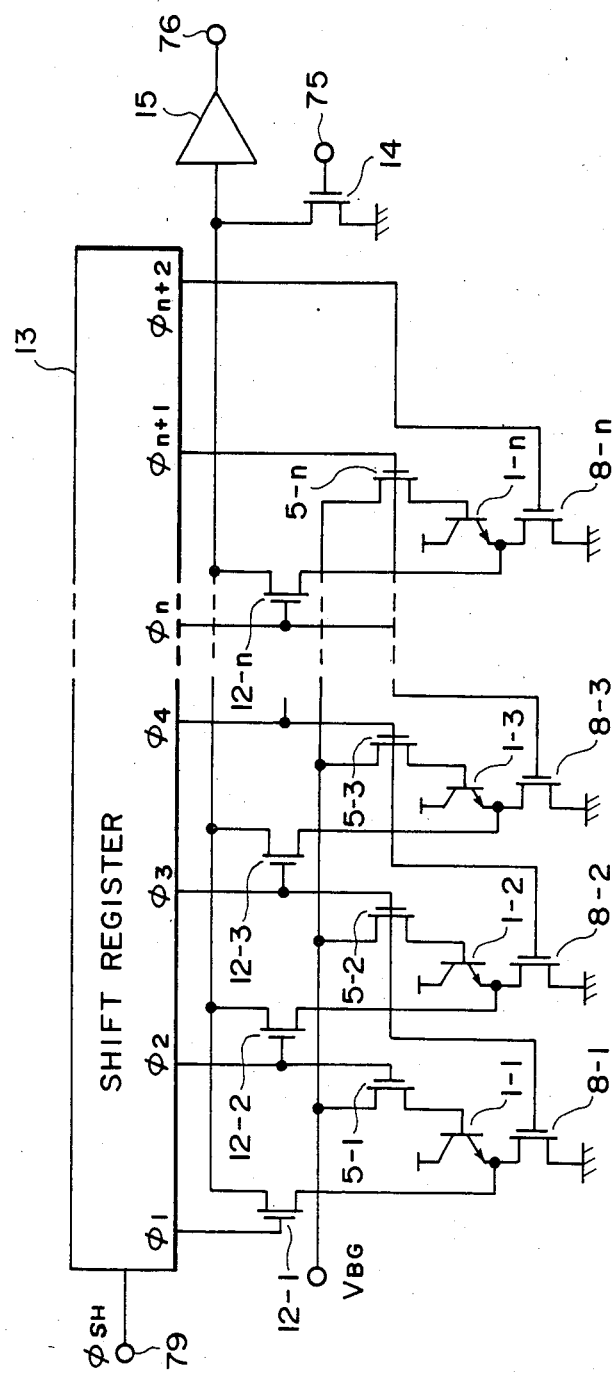
F I G. 5

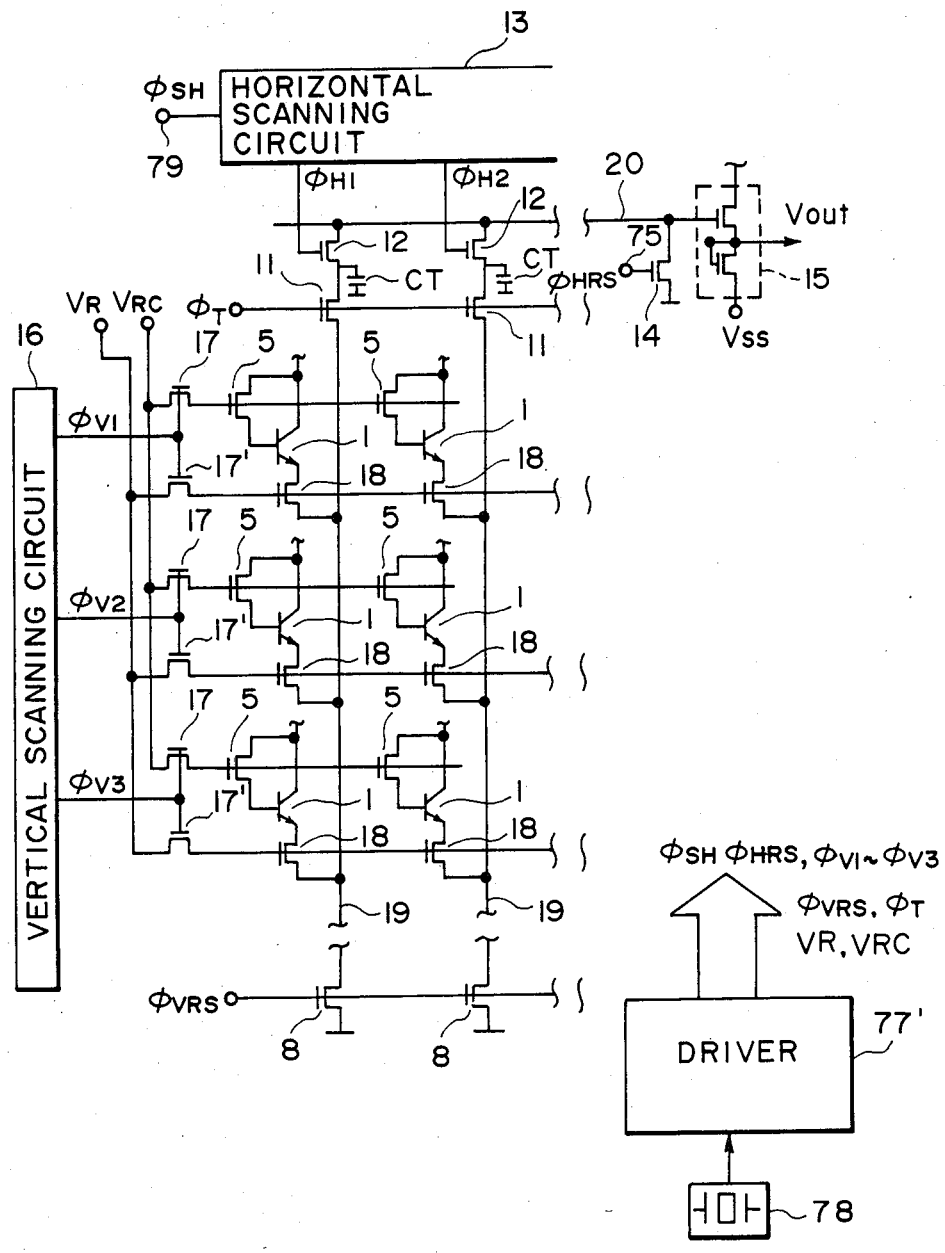
F I G. 6

PHOTOELECTRIC CONVERSION DEVICE WITH REDUCED FIXED PATTERN NOISES

BACKGROUND OF THE INVENTION

1. Field of the Invention

The present invention relates to a photoelectric conversion device having phototransistors and particularly, to a photoelectric conversion device with improved photoelectric conversion characteristics and residual image effect, and reduced fixed pattern noises.

2. Related Background Art

One example of conventional photoelectric conversion devices is disclosed, for example, in Japanese Patent Laid-open Gazettes from 12579/1985 to No. 12765/1985. FIG. 13A is a plan view showing the pattern of a photoelectric conversion device described in the Publications, FIG. 13B is a sectional view along line I—I of FIG. 13A, and FIG. 13C is an equivalent circuit of a photosensor cell of the photoelectric conversion device.

Referring to FIGS. 13A to 13C, each photosensor cell of the photoelectric conversion device is constructed of an n-type silicon substrate 101 and electrically isolated from adjacent photosensor cells by an element isolation region 102 made of, for example, $SiO_2$, $Si_3N_4$, polysilicon or the like.

Each photosensor cell has the following constituent elements: A p region 104 is formed by doping p-type impurity on an n⁻ region 103 of low impurity concentration formed by the epitaxy method or the like. An n⁺ region 105 is formed in the p region 104 by the impurity diffusion method, the ion implantation method or the like. The p region 104 and n⁺ region 105 serve as the base and emitter of a bipolar transistor, respectively.

Formed on an oxide film 106 deposited on the n⁻ region 103 with the above regions is a capacitor electrode 107 of predetermined area which faces the p region 104 with the oxide film 106 interposed therebetween and forms a capacitor Cox. The potential of the p region 104 in a floating state is controlled by a pulse voltage applied to the capacitor electrode 107.

The photosensor cell is constructed further of an emitter electrode 108 connected to the n⁺ region 105, an interconnection 109 for reading a signal via the emitter electrode 108 and sending it to an external circuit, an interconnection 110 connected to the capacitor electrode 107, an n⁺ region 111 of high impurity concentration formed on the substrate 101, and an electrode 112 supplying a potential to the collector of the bipolar transistor.

Next, the fundamental operations of the photosensor constructed as above will be described. First, assuming that the p-base region 104 of the transistor is at a negative potential and at a floating state. Upon incidence of light 113 to the p region 104, carriers corresponding in amount to the incident light are accumulated in the p region 104 (accumulation operation). The base potential changes with the accumulated charge so that the emitter-collector current is controlled. Thus, an electric signal corresponding to the incident light quantity is read out of the emitter electrode 108 at a floating state (readout operation). In order to remove carriers accumulated in the p region 104, the emitter electrode 108 is grounded and the capacitor electrode 107 is applied with a positive refresh pulse voltage. Upon application of a positive refresh pulse voltage, the p region 104 is forward biased relative to the n⁺ region 105 to thereby remove the accumulated carriers. After the refresh pulse falls, the p region 104 resumes a negative potential and hence a floating state (refresh operation). The above accumulation, readout and refresh operations are repeated.

Briefly stating the above proposed method, light-induced carriers are accumulated in the base p region 104 to control a current passing through the emitter and collector electrodes 108 and 112 in accordance with the accumulated charge quantity. The accumulated carriers are read after amplifying them by the amplification function of each cell, thereby achieving a high output and sensitivity, and less noise.

The potential Vp of the base with light-induced carriers accumulated therein is given by Q/C, wherein Q represents the charge of carriers accumulated in the base region, and C represents a capacitor coupled to the base region. As apparent from the above equation, the values of Q and C both become small as the cell size becomes small due to high integration. Thus, the light-induced potential Vp is maintained substantially constant. Therefore, the above proposed method may become useful in the future for a means of obtaining a high resolving power.

A change in base potential $V_B$ while a positive refresh pulse voltage is applied to the capacitor electrode 107 can be given by the equation $(C_{ox}+C_{be}+C_{bc})(dV_B/dt)=-I_B$, where Cbe is a capacitance between base and emitter, Cbc is a capacitance between base and collector, and $I_B$ is a based current.

FIG. 14 shows a change with time in base potential $V_B$ while a positive refresh pulse voltage is applied.

Referring to the graph, the initial base potential when a positive refresh pulse voltage is applied changes with the magnitude of an accumulated voltage Vp. Namely, the base potential which takes a negative potential at an initial condition changes in the positive direction by an accumulated voltage Vp during the accumulation operation, and upon application of a positive refresh pulse voltage to the capacitor electrode 107, the initial base potential rises by the amount corresponding to the accumulated voltage Vp.

As seen from the graph, the period while an initial base potential is retained differs depending upon the magnitude of the initial base potential. After that period, the base potential $V_B$, however, gradually drops irrespective of its initial potential. Therefore, the base potential may be maintained at near zero volt irrespective of the accumulated voltage Vp on condition that a sufficiently long refresh time t is used. As a result, it is possible to make the base potential $V_B$ return to a predetermined negative potential when the positive refresh pulse voltage falls.

In practice, however, the refresh time is limited so as to achieve a high speed operation. For example, a refresh operation terminates when the base potential $V_B$ becomes $V_K$ assuming the refresh time $t=t_0$. In such a case, even if the base potential VB includes a residual potential at the end of a refresh operation, it is possible to make the base potential $V_B$ return to a predetermined negative potential and hence to an initial negative potential at the trailing edge of a positive refresh pulse voltage, so long as the base potential $V_B$ is at a constant potential of $V_K$ at $t=t_0$.

However, repetitive refresh operations of a conventional photoelectric device results in a gradual drop of a residual potential $V_K$, and hence results in a non-linearity of the photoelectric conversion characteristics and a residual image effect. These phenomena will be clarified in the following:

Referring back to FIG. 14, it is now assumed that the initial base potential of a cell under high illumination is 0.8V, and under low illumination 0.4V. In this case, after a refresh operation for a time period $t_0$, the base potential $V_B$ of the high illumination cell takes a predetermined residual potential $V_K$, whereas the low illumination cell takes a residual potential $V_1$ slightly lower than $V_K$. When the refresh pulse rises in such a state, the base potential $V_B$ of the low illumination cell takes a negative potential lower than the initial potential from which the following accumulation and readout operations start. Consequently, as the refresh operation repeats under such low illumination, the base residual potential gradually lowers. If the lower illumination cell with a lowered residual potential is changed to operate in high illumination, an output lower than that corresponding to an incident light quantity will be obtained. Namely, non-linear photoelectric conversion characteristics and residual image effect occur.

The reason for this may be attributable to the deficit in carriers (holes) due to the recombination of holes in the base region. As the low illumination condition continues during which lost carriers (holes) cannot be replenished, the non-linear photoelectric conversion characteristics and residual effect becomes conspicuous.

To solve the above problem, a method of removing carriers in the base regions has been proposed and filed by the present applicant. According to this method, a MOS transistor 113 shown by dot-lines in FIG. 13C is turned on when a refresh operation is initiated to couple an initial base potential as shown in FIG. 14 to the base region and remove the carriers.

Particularly, according to an aspect of the above-proposed photoelectric device, in a phototransistor having a semiconductor region including two main electrode regions and a control electrode region formed between the two main electrode regions, and a capacitor for controlling the potential of the control electrode region in a floating state and accumulating carriers produced by an electromagnetic wave incident to the semiconductor region while controlling via the capacitor the potential of the control electrode region in a floating state, the photoelectric conversion device comprises: first control means for removing said carriers by controlling the potential of said control electrode region via said capacitor; second control means for removing the carriers of said first control means; and means for maintaining, immediately before the carrier removal operation by said second control means, the potential of said control electrode region at a constant potential for a predetermined period using a switch connected to said control electrode region.

By providing, at the control electrode region, means for maintaining the potential of the control electrode region at a constant potential immediately before the start of a carrier removal operation, it becomes possible to set the potential of the control electrode region at a desired value when the carrier removal operation ends. Thus, a non-linearity of photoelectric conversion characteristics and residual image effect can be improved.

Although the above photoelectric device is very effective in improving the non-linearity of photoelectric conversion characteristics and residual image effect, there still remain some problems caused by the capacitor itself formed above the control electrode region for controlling the potential thereof.

Particularly, first the capacitance C coupled to the control electrode region increases by Cox so that the potential Vp to be generated at the control electrode region lowers. Second, dimension tolerance of capacitors Cox in a plurality of phototransistor arrays results in scattering of the light-induced potential Vp.

More in particular, the base potential after the refresh operation is determined depending upon a constant K which is:

$$K = Cdg/(Cox + Cbe + Cbc)$$

where Cbe represents a base-emitter capacitance of a bipolar transistor, Cbc represents a base-collector capacitance, and Cdg represents a gate-drain capacitance of the MOS transistor 113. As a result, if these capacitance values scatter for each element, the base potential after the refresh operation will also scatter, which results in fixed pattern noises of a photosensor cell array.

Third, the capacitor Cox is generally constructed as of MOS structure. Control of the interface between $SiO_2$ and Si is difficult in most cases and in addition, the condition at the interface changes with an electric field, which is another reason of scattering of elements.

SUMMARY OF THE INVENTION

An object of the present invention is to provide a photoelectric device capable of solving the above problems.

To solve the above objects, according to one aspect of an embodiment of a photoelectric conversion device of the invention, in a phototransistor formed with a first main electrode region of a first conductivity type, a second main electrode region of a first conductivity type and a control electrode region of a second conductivity type opposite to the first conductivity type serving as an accumulation region for carriers induced by an electromagnetic wave, the photoelectric conversion device comprises first means for setting said control electrode region selectively at a constant potential and at a floating state and second means for setting said first main electrode region selectively at a low impedance state and at a floating state, whereby said first and second means control the carrier removal, accumulation and readout operations.

The embodiment of the phototransistor of this invention includes a switch connected to the control electrode region, a voltage source connected to the switch, another switch connected to the second main electrode region, and another voltage source or a ground potential connected to the other switch. These switches control the base and emitter of the bipolar transistor. A capacitor for controlling the base potential is not used so that an improved output and a reduced scattering can be achieved.

The other objects and features of the present invention will become apparent from the following detailed description when read in conjunction with the accompanying drawings.

BRIEF DESCRIPTION OF THE DRAWINGS

FIG. 1A shows an equivalent circuit of an embodiment of a photoelectric cell according to the present invention;

FIGS. 1B and 1C show equivalent circuits of second and third embodiments of a photoelectric cell according to the present invention;

FIG. 5 is a schematic diagram showing a fifth embodiment of a photoelectric conversion device of line sensor type according to the present invention;

FIG. 6 is a schematic diagram showing a sixth embodiment of a photoelectric conversion device of line sensor type according to the present invention;

DETAILED DESCRIPTION OF THE PREFERRED EMBODIMENTS

Figure 2:
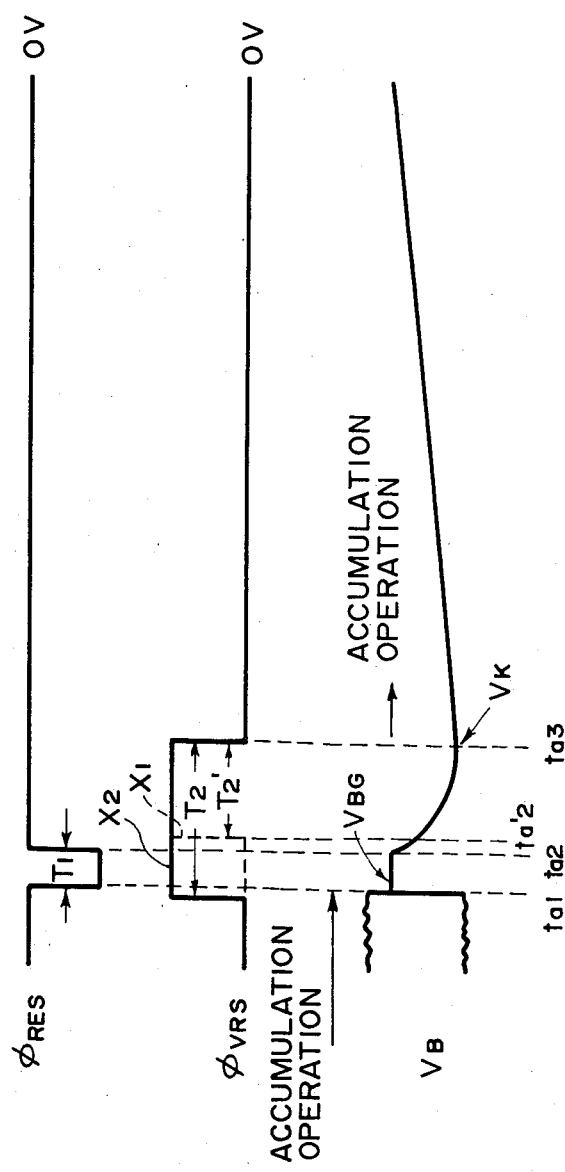
FIG. 2 is a timing chart for explaining the operation of the embodiments shown in FIGS. 1A to 1C.

The embodiments of the present invention will be described in detail with reference to the accompanying drawings.

FIG. 1A shows an equivalent circuit of an embodiment of a photoelectric conversion device according to the present invention.

In the Figure, the collector of an NPN bipolar transistor 1 is connected to a positive voltage source, while the base p region 3 is connected to the drain of a p-channel MOS transistor. The source of the MOS transistor 5 is connected to a voltage source at potential $V_{BG}$. The gate of the MOS transistor 5 is supplied with a pulse signal $\phi_{RES}$. The emitter of the NPN transistor 1 is connected to an output terminal $V_X$ and to the drain of a MOS transistor 8 of which the source is connected to a constant voltage source 10. The gate of the MOS transistor 8 is applied with a pulse signal $\phi_{VRS}$.

The operation of the embodiment thus constructed will be described with reference to FIG. 2.

During an accumulation operation before time ta1, the signal $\phi_{RES}$ is made high level and the transistor 5 is turned off so that the base p region 3 is set at an initial positive potential at a floating state. The signal $\phi_{VRS}$ is made low level and the transistor 8 is turned off so that the emitter electrode 4 is set at a zero potential and at a floating state. The collector electrode 2 is maintained at a positive potential. In this condition, upon application of light, carriers (in this case, holes) corresponding in the incident light quantity are accumulated in the base p region 3.

In this embodiment, a readout operation is carried out simultaneously with the accumulation operation via an emitter output terminal $V_X$. That is an electric signal corresponding to the carriers accumulated in the base p region 3 is read from the emitter electrode 4 at a floating state.

Next, prior to a carrier removal operation after time ta2, the emitter electrode 4 is set at a floating state by making the signal $\phi_{VRS}$ low level as shown by $X_1$ in FIG. 2 and by making the transistor 8 turn off. Alternatively, the emitter electrode 4 is set to be connected to the constant voltage source 10 (including 0 potential) through MOS transistor 8 which is connected to the constant voltage source 10 by making the signal $\phi_{VRS}$ high level as shown by $X_2$ and by making the transistor 8 turn on. Then, when low level pulse $\phi_{RES}$ is applied to the gate electrode 6 of the p-channel MOS transistor 5 during the period ta1–ta2, in the situation where a potential of the base p region 3 is lower than that of the source electrode of the MOS transistor 5 because of a dark state or small incident light quantity, holes are injected into the base p region 3 so that the potential of the region 3 takes a value of voltage of voltage source 7 connected to the source electrode of the MOS transistor 5, such as 2(V). $V_B$ of FIG. 2 shows the potential of the base p region 3. $V_{BG}$ shows the value of the voltage source 7. On the other hand, in the situation where the potential of the base p region 3 is higher than that of the source electrode 5' of the MOS transistor 5 because of large incident light quantity, a portion of holes accumulated in the base p region 3 is removed so that the potential of the region 3 takes the potential $V_{BG}$ of the source electrode 5', such as 2(V). In this case, set potential of $V_{BG}$ of the voltage source 7 connected to the source electrode 5' is taken to be sufficiently higher than the residual potential $V_K$ at completion of the carrier removal operation even if the potential of the region 3 at a start point ta2 of the carrier removal operation performed after ta2 is a dark state. The period of this state is called a first period (during $T_1$ shown in FIG. 2).

Next, in a carrier removal operation after time ta2, the emitter electrode 4 is connected to, through the MOS transistor 8 connected to this electrode, the voltage source 10 having a potential sufficiently lower than the potential $V_{BG}$ of the voltage source connected to the source electrode 5'. In addition, the gate electrode of the p-channel MOS transistor 5 is made high level to make it non-conductive. This period while the MOS transistor 8 connected to the emitter electrode is made conductive is called a second period (during $T_2$ or $T_2'$ shown in FIG. 2). During the second period, the holes accumulated in the base p region 3 recombine with electrons injected from the emitter electrode 4 to the base p region 3 and are removed therefrom. Since the potential of the base p region 3 is set sufficiently high during the first period, the base potential at the start of the second period is $V_{BG}$ sufficiently higher than the residual potential $V_K$ irrespective of the degree of illuminance. As a result, after the second period $T_2$, the potential of the base p region 3 takes a constant potential $V_K$ irrespective of the degree of illuminance. Thereafter (i.e., after time Ta3), the MOS transistor 8 connected to the emitter electrode 4 is made non-conductive and hence in a floating state so that the similar accumulation and readout operation as described before can proceed (refer to FIG. 2).

Use of the first period during which the potential of the base p region 3 takes a constant potential enables to make the potential of the base p region 3 after the second period have a constant potential. Thus, it is possible to completely avoid the non-linearity of the photoelectric conversion characteristics and residual image effect under a low illumination state. Further, since a conventional control using a capacitor is not employes, a drop in output voltage and scattering thereof cannot occur.

An NPN type bipolar transistor has been used in the above embodiment, but a PNP type bipolar transistor may also be used. In this case, holes are substituted for electrons and vice versa in the above description. The sign of voltage is also to be inverted. Instead of bipolar transistors of the above embodiment, other semiconductors such as FETs (Field Effect Transistors) and SITs (Static Induction Transistors) may also be used.

Further, the MOS switch connected to the base regions may be of a p-channel or n-channel type. An n-channel type MOS transistor connected to the base region is shown in FIG. 1B as the second embodiment. An SIT type phototransistor is shown in FIG. 1C as the third embodiment.

Figure 3:
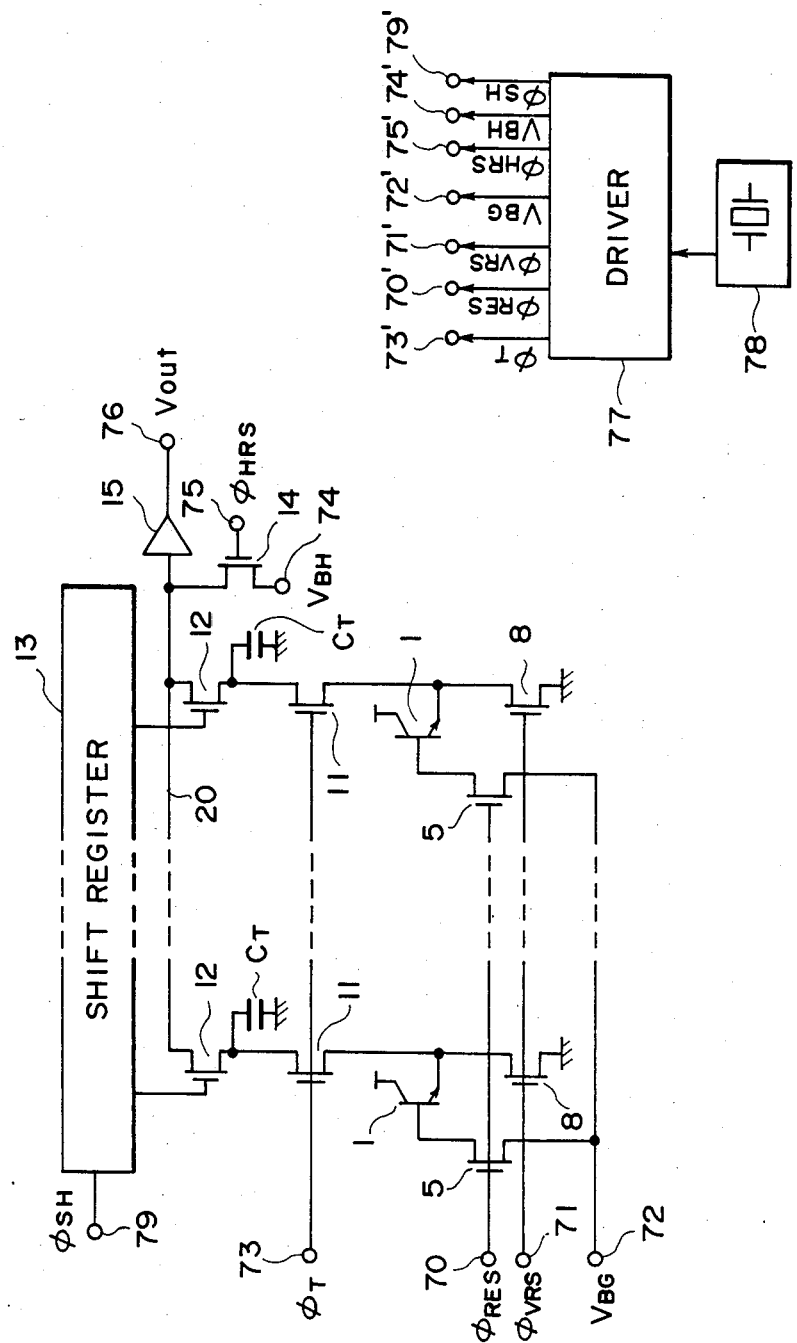
FIG. 3 is a schematic diagram showing a fourth embodiment of a photoelectric conversion device of line sensor type according to the present invention.

FIGS. 3 shows a fourth embodiment of the present invention. In this embodiment, photoelectric cells shown in FIG. 1A are disposed in an array. Gates of MOS transistors 5 connected to the base of each bipolar transistor 1 are connected in common to a terminal 70 to which a pulse $\phi_{RES}$ is applied. Sources of the MOS transistors 5 are connected in common to a terminal 72 to which a potential $V_{BG}$ is supplied.

Gates of MOS transistors 8 connected to the emitter of each bipolar transistor 1 are connected in common to a terminal 71 to which a pulse $\phi_{VRS}$ is applied.

The emitter of each transistor 1 is connected via each MOS transistor 11 to a corresponding light-shielded capacitor $C_T$ whose charge is supplied to an output amplifier 15 via each MOS transistor 12. The output signal from the amplifier 15 is outputted at a terminal 76.

The MOS transistors 12 are sequentially shifted by a shift register 13 which is inputted with shift pulses $\phi_{SH}$ from a terminal 79 to sequentially shift a high level signal output thereof.

The gates of the MOS transistors 11 are connected in common to a terminal 73 to which a pulse $\phi_T$ is applied. The input of the amplifier 15 is connected via a MOS transistor 14 to a terminal 74 to which a constant potential $V_{BH}$ is supplied.

The gate of MOS transistor 14 is supplied with a pulse $\phi_{HRS}$ from a terminal 75.

A clock driver 77 outputs, at predetermined timings in response to a clock signal from an oscillator 78, pulses $\phi_T$, $\phi_{RES}$, $\phi_{VRS}$, $\phi_{HRS}$ and $\phi_{SH}$ and constant potential $V_{BG}$ and $V_{BH}$, respectively to terminals 73', 70', 71', 75', 79', 72', and 74'.

The terminals 70 to 75 and 79 are connected respectively to terminals 70' to 75' and 79'

Figure 4:
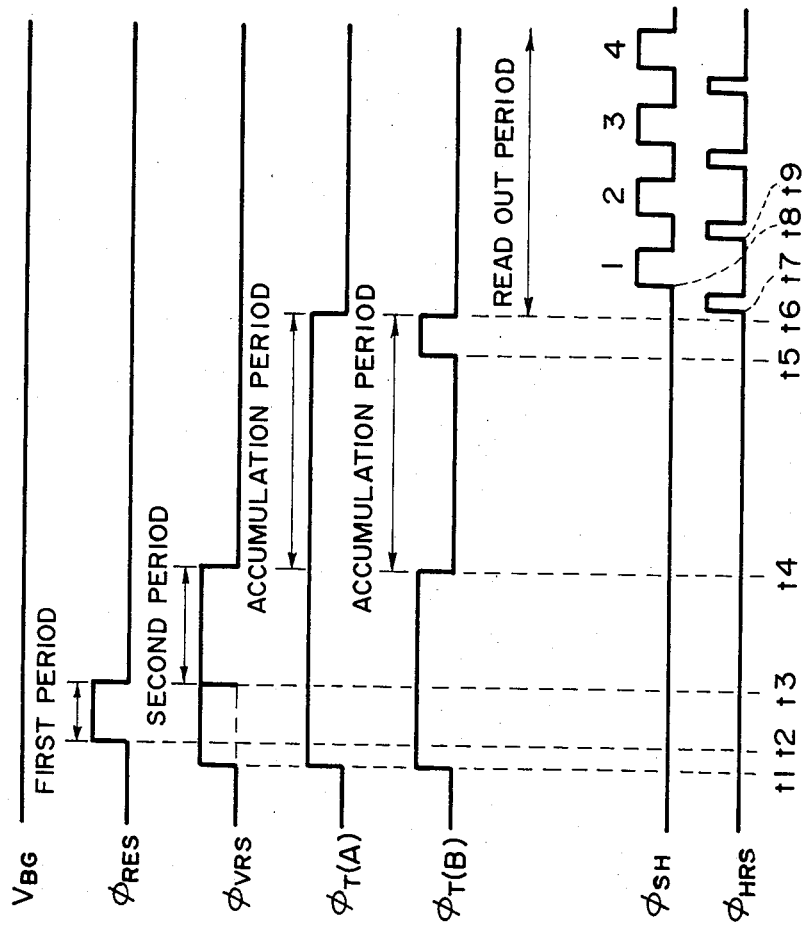
FIG. 4 is a timing chart for explaining the operation of the embodiment shown in FIG. 3.

FIG. 4 is a timing chart showing an example of pulse timings outputted from the clock driver 77.

The operation of the photosensor cell array constructed as above will be described with reference to the timing chart of FIG. 4, wherein $\phi_T(A)$ and $\phi_T(B)$ are pulses used respectively in different embodiment of the operation.

First, the embodiment using $\phi_T(A)$ will be described. After $\phi_T$ and $\phi_{RES}$ are made high level at time t1, $\phi_{RES}$ is made high level at time t2. Then all the MOS transistors 5 are turned on and the potential $V_{BG}$ is applied to the base of each transistor 1. Therefore, holes are injected to the base of the transistor 1 if the base residual potentail is smaller than $V_{BS}$, whereas excessive carriers are recombined if it is larger than $V_{BG}$, thus maintaining the base potential at $V_{BG}$.

During this time, $\phi_T$ takes a high level so that the charge of the capacitor $C_T$ is discharged from the MOS transistor 8. Next, when $\phi_{RES}$ rises at time t3, carriers accumulated in the base are gradually recombined and removes because $\phi_{VRS}$ is still high level. Since the base potential has been set at $V_{BG}$ as described before, the amount of carriers remaining in the base at time t4 is equal for each transistor irrespective of the amount of carriers remaining in the base before time t2.

After $\phi_{VRS}$ falls at time t4, carriers light-induced at the base region are gradually accumulated by the capacitor $C_T$ until $\phi_T$ falls at time t6 because the emitter of the transistor 1 is connected to the capacitor $C_T$ via the MOS transistor 11.

As $\phi_T$ falls at time t6, the information photoelectrically obtained by each transistor has now been accumulated and stored in the capacitor $C_T$, and the information after this will not be accumulated in the capacitor $C_T$.

One pulse $\phi_{HRS}$ is supplied at time t7 to the MOS transistor 14 to turn it on and drain the residual charge in the parasitic capacitor on the output line 20 to the ground. Next, one pulse SH is supplied at time t8 to the shift register 13 to start scanning each transistor 12. As the transistor 12 is made turned on, the charge accumulated in the capacitor $C_T$ is outputted at the terminal 76 via the amplifier 15. Immediately after one transistor 12 is made turned on to read the charge in the capacitor $C_T$ connected thereto as described before, the output line 20 is again cleared upon application of $\phi_{HRS}$. These operations are repeated to sequentially read the signals photoelectrically converted during the period from time t4 to t6.

After completion of reading the signals for all the transistors 1, the refresh and accumulation operations similar to those during the period from time t1 to t6 are carried out and thereafter, a readout operation similar to that after time t7 is carried out. The refresh, accumulation and readout operations are repeated in this order.

The timing of $\phi_T(B)$ is used for an improved version of the above embodiment using the timing of $\phi_T(A)$. In case of the timing of $\phi_T(B)$, a low level is used during the period from time t4 to time t5. Consequently, carriers light-induced in the base region of the transistor are not accumulated in the capacitor $C_T$, but accumulated in the base region it self of the transistor 1. Upon application of pulse $\phi_T(B)$ during the period from time t5 to time t6, a signal corresponding to the carriers accumulated in the base region is transferred to the capacitor $C_T$. In this case, it was recognized from the experiments that the output increased by 20 to 30% more than that by $\phi_T(A)$ and the range of scattering of sensitivities was remarkably narrowed.

Although $\phi_{VRS}$ takes a high level during the period from time t1 to time t3, it may take a low level during the period. By doing so, a current flowing through the base-emitter during the period will be stopped, thus avoiding unnecessary consumption of a power supply.

FIG. 5 shows an example of the arrangement of a fifth embodiment of a photoelectric conversion device of line sensor type according to the present invention.

The embodiment shown in FIG. 5 differs from that shown in FIG. 3 in the following points: in the embodiment shown in FIG. 3, the photosensor cells are supplied with $\phi_{RES}$, $\phi_{VRS}$ and $\phi_T$ collectively to perform the refresh, accumulation and readout operations. Whereas in the embodiment shown in FIG. 5, each photosensor cell is independently driven during the refresh, accumulation and readout operations. In addition, in the later embodiment, the capacitor $C_T$ is not used for reading a signal from each photosensor cell.

This embodiment will now be described in detail, wherein elements given identical numbers to those in FIGS. 1 to 4 have same functions as those of the latter. Particularly, MOS transistors 12-1 to 12-n (n is integer) have same functions as the MOS transistors 12, MOS transistors 1-1 to 1-n have same functions as the MOS transistors 1, MOS transistors 5-1 to 5-7 have same functions as the MOS transistors 5, and MOS transistors 8-1 to 8-n have same functions as the MOS transistors 8.

A shift register 13 sequentially outputs high level pulses $\phi_1$ to $\phi_{n+2}$ in response to a shift pulse $\phi_{SH}$.

MOS transistors 5−m, 12−(m+1) and 8−(m−1) are arranged to be turned on by a common pulse $\phi(m+1)$, wherein m is an integer equal to and smaller than (n+1). Therefore, when a pulse $\phi_m$ is supplied, the potential of the bipolar transistor 1−(m−1) becomes $V_{BG}$ so that a readout operation for the transistor 1-m and a refresh operation for the transistor 1−(m−2) are carried out.

Thus, as a sequential readout operation for each transistor effected by a readout pulse, a sequential refresh operation is effected with a delay of two pulses after the readout pulse.

With such an arrangement, fluctuation to be caused by dark current noises or the like does not occur because there is no difference between periods from the end of accumulation to the start of readout for each photoelectric cell.

FIG. 6 shows a sixth embodiment of the present invention applied to an area image sensor. In the figure, identical numbers are used for similar elements to those in FIGS. 1 to 5.

In the Figure, reference number 16 represents a vertical scan circuit, and reference numbers 17, 17' and 18 represent MOS transistors. A driver circuit 77' outputs pulses $\phi_{SH}$, $\phi_{HRS}$, $\phi_{V1}$ to $\phi_{V3}$, $\phi_{VRS}$, $\phi_T$, $V_R$, $V_{RC}$ and so on.

Figure 7:
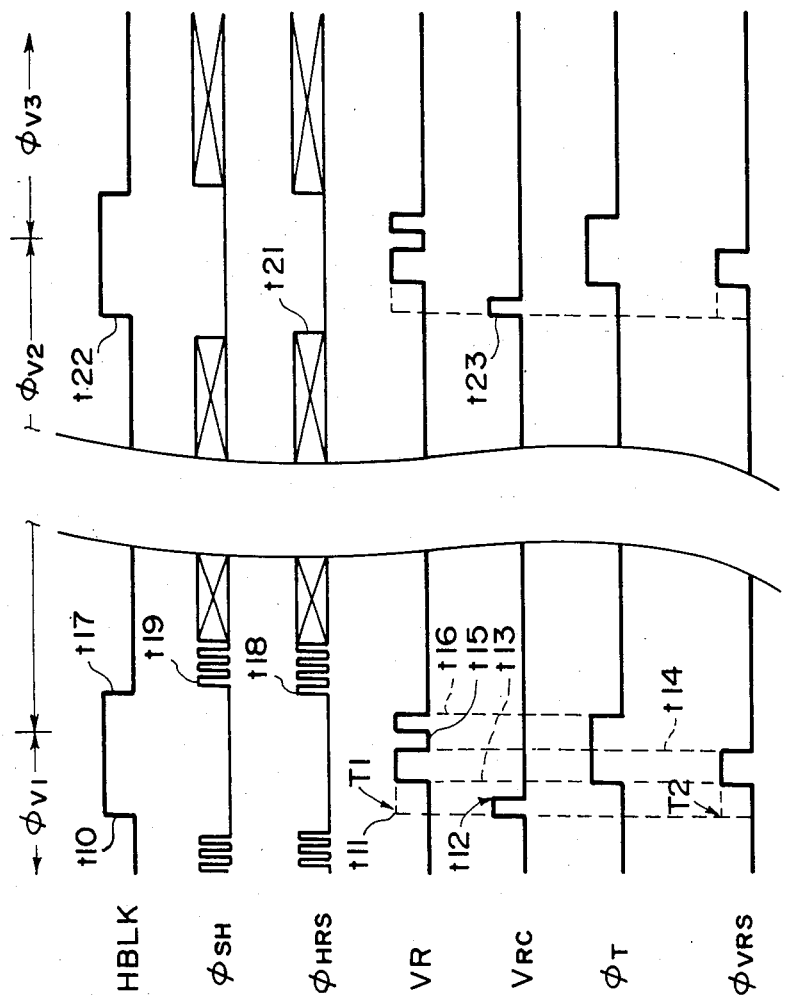
FIG. 7 is a timing chart for explaining the operation of the embodiment shown in FIG. 6.

FIGS. 7 is a timing chart showing output pulses from the driver circuit 77' shown in FIG. 6.

The operation of the area image sensor shown in FIG. 6 will be described with reference to the timing chart.

First, $\phi_{V1}$ is made high level and $\phi_{V2}$ and $\phi_{V3}$ are made low level so that the first row is selected among the matrix of rows and columns of the transistors 1.

The following operations are carried out during a horizontal blanking period from time t10 to time t17:

Particularly, $V_{RC}$ is maintained high level during the period from time t11 to t12 so that the MOS transistors 5 are made turned on to set the bases of the transistors 1 at a collector potential (constant potential).

Thereafter, $V_R$ and $\phi_{VRS}$ are made high level during the period from time t13 to time t14 and $\phi_T$ is made high level during the period from time t13 to t16. Thus, the MOS transistors 8, 18 and 11 are made turned on so that carriers of the base of the transistors 1 are extinguished by a current flowing through the emitters and the MOS transistors 8. At the same time, a residual charge in the capacitor $C_T$ is drained to the ground.

After time t14, $\phi_{VRS}$ and $V_R$ are made low level to start the accumulation operation for the transistors at the first row. After $\phi_{V1}$ and $\phi_{V3}$ made low level and $0_{V2}$ is made high level, $V_R$ is maintained high level during the period from time t15 to time t16.

Then, the voltages corresponding to carriers having been accumulated in the transistors 1 at the second row is transferred to the capacitor $C_T$ via the MOS transistors 5.

Thereafter, the sequential supply of one pulse $\phi_{HRS}$ at time t18 and one pulse $\phi_{SH}$ at time t19 and so on enables a sequential readout of the charge of each capacitor $C_T$ via the amplifier until time t21, in a similar manner as described with FIG. 4. When the next horizontal blanking period starts at time t22, a refresh operation for the transistors at the second row starts from time t23.

As described above, during each horizontal blanking period, a refresh operation for the row whose readout operation has been completed is carried out and the signals for the next row are transferred to the capacitors $C_T$ which are sequentially read during the next horizontal scan period.

$\phi_{V1}$ to $\phi_{V3}$ are sequentially switched during one horizontal scan period by the vertical shift register 16 and circulate once during one vertical scan period.

Although only three rows are shown in FIG. 6, obviously the number of rows corresponds to that of horizontal scan lines during one vertical scan period.

Figure 8:
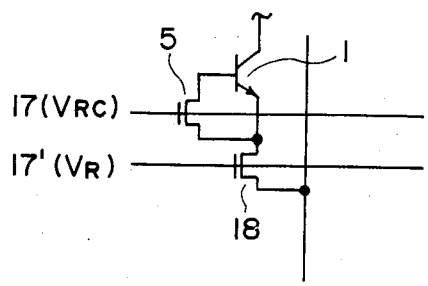
FIGS. 8 and 9 show equivalent circuits of other examples of the photoelectric conversion device shown in FIG. 6.
Figure 9:
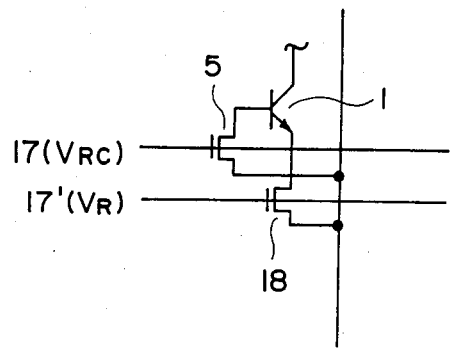

FIGS. 8 and 9 show modifications of interconnection of each photoelectric cell shown in FIG. 6. As shown in FIG. 8, the source of a MOS transistor 5 may be connected to the drain of a MOS transistor 18. In this case, $V_R$ and $\phi_{VRS}$ are made high level also during the period from time t11 to t13 shown in FIG. 7.

Particularly, since $V_R$ and $\phi_{VRS}$ are made high level during the period from time t11 to time t13, when $V_{RC}$ is made high level during the period from time t11 to time t12, the base of the transistor 1 is grounded to make residual carriers in the base recombine and extinguish.

In the modification shown in FIG. 9, the source of the MOS transistor 5 shown in FIG. 5 is connected to a vertical signal line 19. In this case, $\phi_{VRS}$ is made high level during the period from time t11 to time t13 shown in the timing chart of FIG. 7. $\phi_{VR}$ is maintained low level. When $V_{RC}$ is made high level during the period from time t11 to t12, carriers in the base of the transistor 1 are drained to the ground and extinguished.

Figure 10:
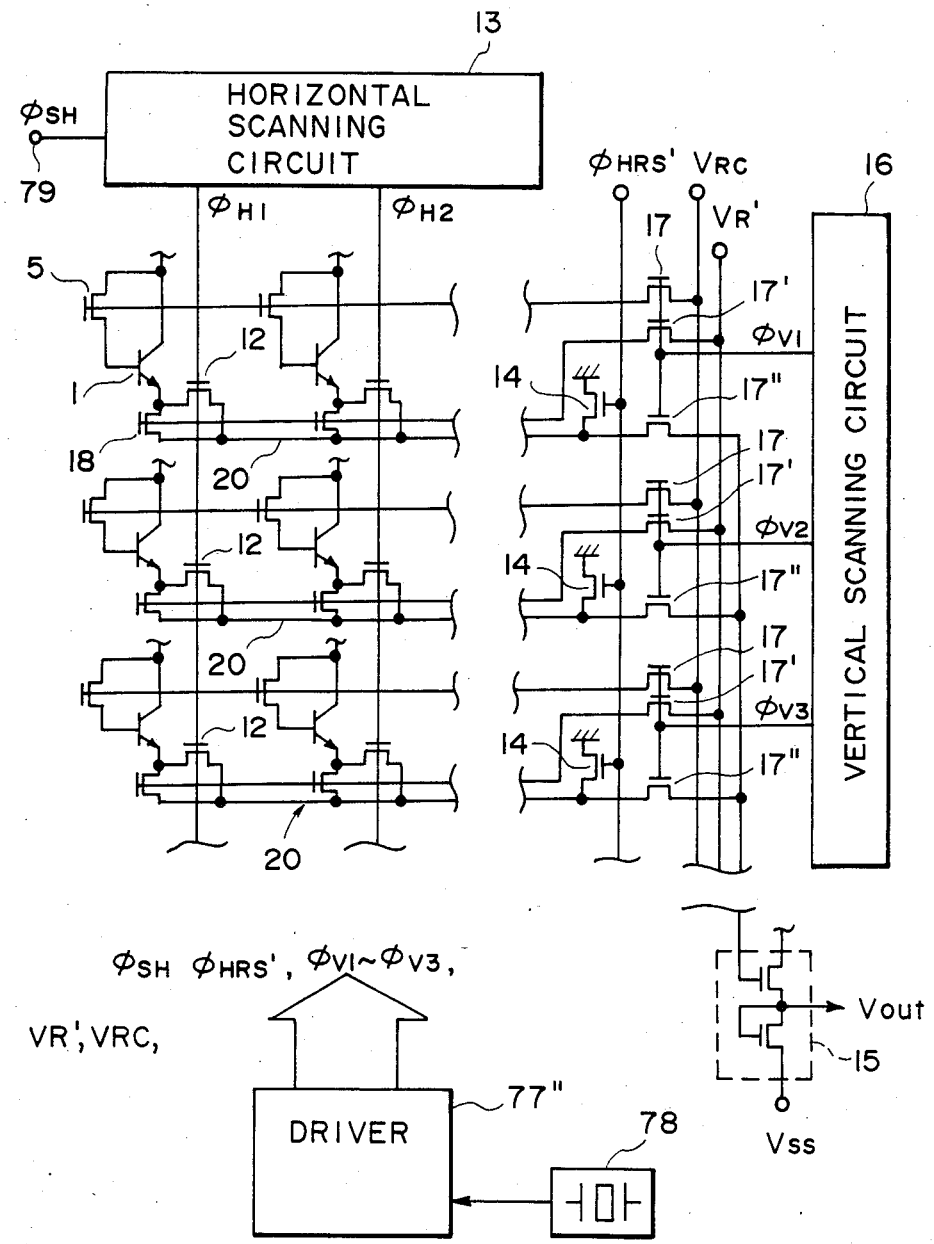
FIG. 10 is a schematic diagram of a seventh embodiment of a photoelectric conversion device according to the present invention.

FIG. 10 shows a modification of the area image sensor shown in FIG. 6. The differences of this modification from the area image sensor shown in FIG. 6 are as follows: A horizontal signal line 20 is provided for each row and a MOS transistor 14 is provided for each horizontal signal line in order to selectively connect the horizontal line to the ground. The emitter of each transistor 1 may be connected selectively to the horizontal signal line via a MOS transistor 12 instead of the vertical signal line. A MOS transistor 12 is accordingly provided between the emitter of each transistor 1 and each horizontal signal line. The source of a MOS transistor 18 connected to the emitter of each transistor 1 is connected to a corresponding horizontal line instead of the vertical signal line. The vertical line shown in FIG. 6, the capacitors connected to the vertical line, the MOS transistors 11 and 8 and the like are omitted. MOS transistors 17" are provided. And some other different points are included.

Figure 11:
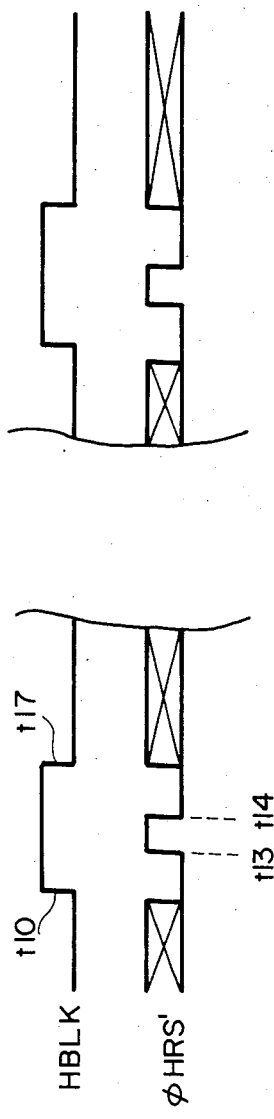
FIG. 11 shows the main part of a timing chart for explaining the operation of the embodiment shown in FIG. 10.

Of the outputs from a driver circuit 77", $\phi_{HRS'}$ is slightly different from $\phi_{HRS}$ shown in the timing chart of FIG. 7. As shown in FIG. 11, $\phi_{HRS'}$ is maintained high level also during the period from time t13 to t14 shown in FIG. 7. $V_{R'}$ is maintained low level during the period from time t15 to t16. The timings of other pulses $\phi_{SH'}$ $\phi_{V1}$ to $\phi_{V3}$ and $V_{RC}$ are the same as those shown in FIG. 7.

With the arrangement as above, the base of the transistor 1 is maintained at the same potential as that of the collector during the period from time t11 to t12. During the time period from time t13 to time t14, carriers in the base are gradually drained from the ground via the MOS transistor 14. After $\phi_{V1}$ and $\phi_{V3}$ are made low level and $\phi_{V2}$ is made high level, the carriers accumulated in the base of the second row transistors during one vertical scan period from time t15 to t16 are passed to the amplifier 15 via the signal line 20 and the MOS transistor 17" and read out, by sequentially turning on the MOS transistors 12 by the horizontal scan circuit 13.

With the arrangement as above, the blooming effect is not likely to occur as compared with the embodiment shown in FIG. 6.

Figure 12:
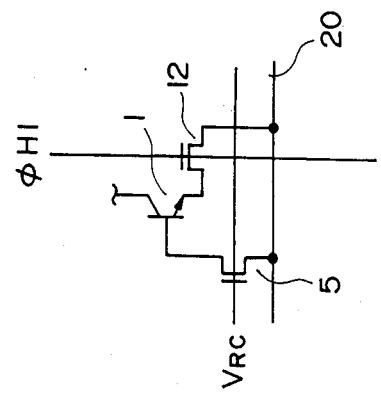
FIG. 12 shows an equivalent circuit of another example of the photoelectric conversion device shown in FIG. 10.
Figure 13A:
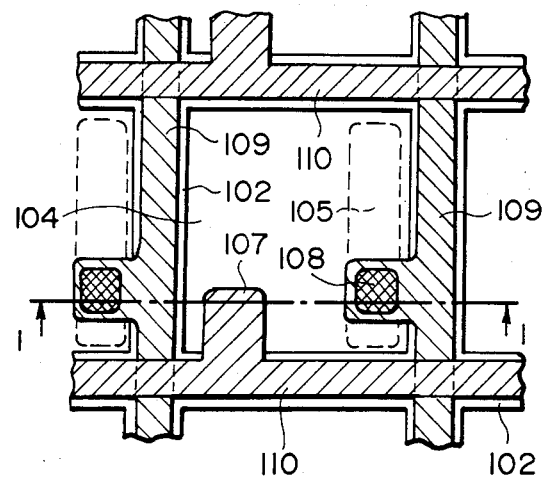
FIG. 13A is a schematic plan view showing a conventional photoelectric conversion device.
Figure 13B:
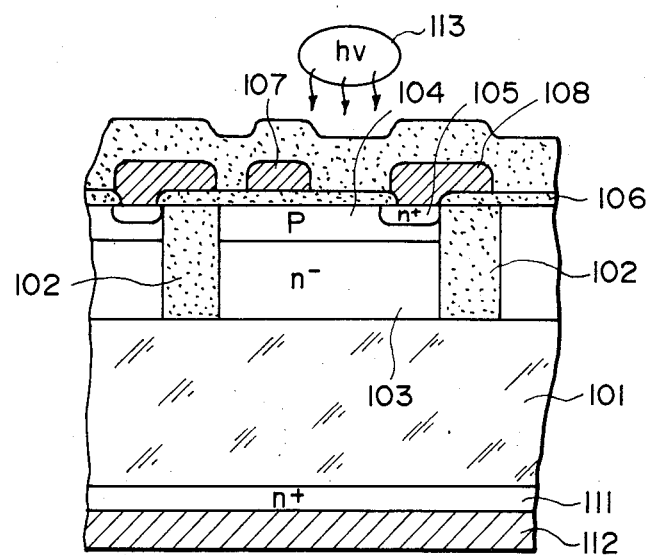
FIG. 13B is a cross section along line I—I of FIG. 13A.
Figure 13C:
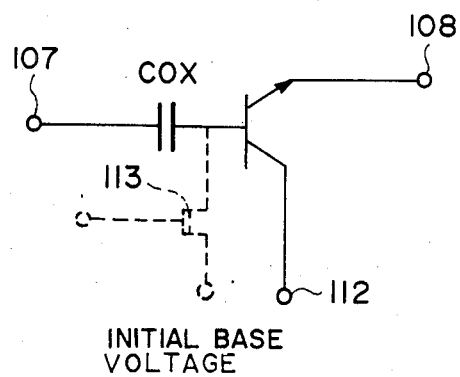
FIG. 13C shows an equivalent circuit of the photoelectric conversion device shown in FIGS. 13A and 13B.
Figure 14:
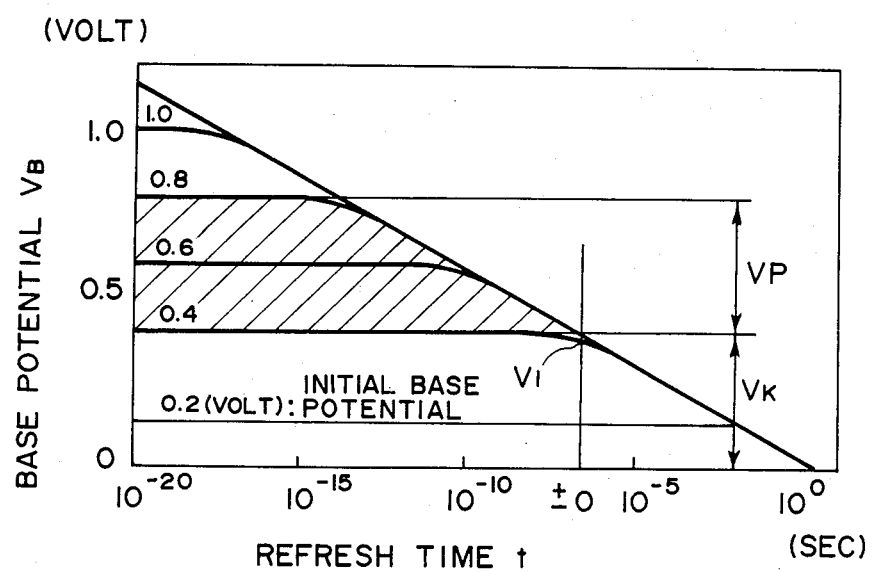
FIG. 14 is a graph showing a change with time in base potential during a carrier removal operation.

FIG. 12 shows another example wherein one end of the MOS transistor 5 is connected to a signal line 20 instead of the collector to omit the MOS transistor 18. In this case, of the timings for driving the embodiment shown in FIG. 10, $\phi_{HRS'}$ is made high level during the period from t11 to t13 or from time t11 to t12, and high level during the period from time t13 to time t14. Namely, if the horizontal signal line 20 is maintained ground level while $V_{RC}$ is maintained high level during the period from t11 to t12, the residual carriers in the base are extinguished due to the zero level of the base.

As described so far, various photoelectric devices such as line image sensors and area image sensors according to the present invention can obtain a high output, less residual image and fixed pattern noises even if they are highly integrated or compacted. Thus, numeral advantageous and features are realized useful for this industrial field.

We claim:

1. A photoelectric conversion device comprising:
   a first main electrode region of a first conductivity type;
   a second main electrode region of a first conductivity type;
   a control electrode region of a second conductivity type opposite to the first conductivity type serving as an accumulation region for carriers induced by an electromagnetic wave;
   first means for setting said control electrode region selectively at a constant potential and at a floating state;
   second means for setting said first main electrode region selectively at a low impedance state and at a floating state; and
   control means for setting said control electrode region at a floating state using said first means and setting said first main electrode region at a floating state, in order to read said carriers accumulated in said control electrode region.

2. A photoelectric conversion device according to claim 1, wherein said control means controls, in order to extinguish said carriers by said first and second means, to maintain said control electrode region at a constant potential and said first main electrode region at a low impedance state or a floating state during a first period, and maintain said control electrode region at a floating state and said first main electrode region at a low impedance state during a second period after said first period.

3. A photoelectric conversion device according to claim 1, said control means controls to perform an accumulation operation for said carriers by setting said control electrode region and said first main electrode region at a floating state using said first and second means.

4. A photoelectric conversion device according to claim 1, wherein said first means for setting said control electrode region at a constant potential or a floating state includes a switch connected to said control electrode region and a voltage source connected to said control electrode region via said switch.

5. A photoelectric conversion device according to claim 4, wherein said switch connected to said control electrode region is a MOS transistor whose one main electrode is said control electrode and the other main electrode is formed with a region of the same conductivity type as that of said control electrode region.

6. A photoelectric conversion device according to claim 4, wherein said switch connected to said control electrode region is a MOS transistor whose two main electrode regions are of the conductivity type opposite to that of said control electrode region.

7. A photoelectric conversion device according to claim 1, wherein said second means for setting said first main electrode region at a low impedance or a floating state includes a switch connected to said first main electrode region and a ground line or a voltage source connected to said first main electrode region via said switch.

8. An image pickup device comprising:
   (a) image pickup means with an amplification function comprising a control electrode region for accumulating a charge corresponding to an incident light and a plurality of main electrode regions;
   (b) first means for selectively setting said control electrode region at a floating state or at a predetermined potential;
   (c) control means for switching one of said main electrode regions from a low impedance state to a high impedance state in order to switch said control electrode region from a charge extinguishing state to a charge accumulation state, while said control electrode region is being set at a floating state by said first means.

9. An image pickup device according to claim 8, further comprising second means for setting said electrode region selectively at a low impedance state and at a floating stand, and wherein said control means controls, in order to extinguish said charge by said first and second means, to maintain said control electrode region at a constant potential and said main electrode region at a low impedance state or a floating state during a first period, and maintain said control electrode region at a floating state and said main electrode region at a low impedance state during a second period after said first period.

10. An image sensor according to claim 8, wherein said first means for setting said control electrode region at a constant potential or a floating state includes a switch connected to said control electrode region and a voltage source connected to said control electrode region via said switch.

11. An image pickup device according to claim 10, wherein said switch connected to said control electrode region is a MOS transistor whose one main electrode is said control electrode and the other main electrode is formed with a region of the same conductivity type as that of said control electrode region.

12. An image pickup device according to claim 10, wherein said switch connected to said control electrode region is a MOS transistor whose two main electrode regions are of the conductivity type opposite to that of said control electrode region.

13. An image pickup device according to claim 8, further comprising second means for setting said main electrode region selectively at a low impedance state and at a floating state, and wherein said second means for setting said main electrode region at a low impedance or a floating state includes a switch connected to said main electrode region and a ground line or a voltage source connected to said main electrode region via said switch.

14. An image pickup device according to claim 8, wherein said control electrode region and said plurality of main electrode regions constitute a transistor.

15. An image pickup device according to claim 14, wherein said transistor is a bipolar transistor.

16. An image pickup device according to claim 14, wherein said transistor is a static induction transistor.

* * * * *

UNITED STATES PATENT AND TRADEMARK OFFICE
CERTIFICATE OF CORRECTION

PATENT NO. : 4,810,896

DATED : March 7, 1989

INVENTOR(S) : NOBUYOSHI TANAKA ET AL.

It is certified that error appears in the above-identified patent and that said Letters Patent is hereby corrected as shown below:

SHEET 7 OF 12

FIG. 7, "VR" should read --$V_R$--.

COLUMN 2

Line 59, "base potential VB" should read --base potential $V_B$--.

COLUMN 3

Line 3, "following:" should read --following.--.

COLUMN 7

Line 10, "employes," should read --employed,--.

COLUMN 8

Line 5, "potentail" should read --potential--.
    Line 12, "removes" should read --removed--.
    Line 30, "pulse SH" should read --pulse $\phi_{SH}$--.
    Line 53, "it self" should read --itself--.

COLUMN 9

Line 17, "MOS transistors 5-1 to 5-7" should read --MOS transistors 5-1 to 5-n--.
    Line 31, "effected" should read --is effected--.
    Line 48, "FIGS.7" should read --FIG.7--.

UNITED STATES PATENT AND TRADEMARK OFFICE
CERTIFICATE OF CORRECTION

PATENT NO. : 4,810,896
DATED : March 7, 1989
INVENTOR(S) : NOBUYOSHI TANAKA ET AL.      Page 2 of 2

It is certified that error appears in the above-identified patent and that said Letters Patent is hereby corrected as shown below:

COLUMN 10

Line 5, "made" should read --are made--.
    Line 6, "$O_{v2}$" should read --$\phi_{v2}$--.

COLUMN 11

Line 14, "$O_{v1}$" should read --$\phi_{v1}$--.
    Line 39, "numeral" should read --numerous--.
    Line 40, "advantageous" should read --advantages--.

COLUMN 12

Line 6, "said" should read --wherein said--.
    Line 41, "potential;" should read --potential; and--.
    Line 52, "floating stand," should read --floating state,--.
    Line 61, "image sensor" should read --image pickup device--.

Signed and Sealed this

Twenty-second Day of May, 1990

*Attest:*

HARRY F. MANBECK, JR.

*Attesting Officer*    *Commissioner of Patents and Trademarks*